(12) United States Patent
Lai et al.

(10) Patent No.: US 7,532,487 B2
(45) Date of Patent: May 12, 2009

(54) GROUNDING STRUCTURE FOR A LIQUID CRYSTAL MODULE

(75) Inventors: Ching-Kun Lai, Changhua (TW); Mei-Hui Lin, Yung Ho (TW); Chung-Te Lee, Hsinchu (TW)

(73) Assignee: Hannstar Display Corporation, Taipei (TW)

( * ) Notice: Subject to any disclaimer, the term of this patent is extended or adjusted under 35 U.S.C. 154(b) by 118 days.

(21) Appl. No.: 11/386,193

(22) Filed: Mar. 21, 2006

(65) Prior Publication Data

US 2006/0160411 A1    Jul. 20, 2006

Related U.S. Application Data

(62) Division of application No. 10/671,386, filed on Sep. 25, 2003, now Pat. No. 7,038,741.

(30) Foreign Application Priority Data

Feb. 27, 2003    (TW) .............................. 92203109 U

(51) Int. Cl.
*H05K 9/00* (2006.01)
(52) U.S. Cl. ........................ 361/816; 361/800; 361/799
(58) Field of Classification Search ................. 361/679, 361/683, 687, 749, 748, 796, 799, 784, 600, 361/800, 816, 818; 439/56, 58, 492, 495, 439/60, 92, 439, 67, 55; 174/254, 250, 377, 174/382, 383, 350, 68.1, 50, 520, 547, 548
See application file for complete search history.

(56) References Cited

U.S. PATENT DOCUMENTS

| 4,569,000 | A  | * | 2/1986  | Noji ............................ 361/730 |
| 5,537,177 | A  |   | 7/1996  | Terunuma |
| 6,154,261 | A  |   | 11/2000 | Shim |
| 6,295,103 | B1 |   | 9/2001  | Yamatani et al. |
| 6,392,723 | B1 | * | 5/2002  | Sugiyama et al. ............. 349/58 |
| 6,411,352 | B1 | * | 6/2002  | Kim ............................. 349/58 |
| 6,587,355 | B2 | * | 7/2003  | Park et al. .................... 361/799 |
| 6,686,979 | B2 |   | 2/2004  | Yoshino |
| 6,930,734 | B2 | * | 8/2005  | Lee .............................. 349/58 |
| 2001/0050732 | A1 | * | 12/2001 | Okamoto et al. ............. 349/58 |
| 2004/0257515 | A1 | * | 12/2004 | Lee ............................. 349/150 |

* cited by examiner

*Primary Examiner*—Hung S Bui
(74) *Attorney, Agent, or Firm*—Thomas, Kayden, Horstemeyer & Risley

(57) ABSTRACT

A grounding structure of a liquid crystal module is disclosed. The grounding structure is adapted for protecting a control printed circuit board of the liquid crystal module from electro-magnetic interference. In one embodiment, the grounding structure comprises: i) a frame configured to receive the control printed circuit board, ii) a grounding conductive sheet, wherein one end of the grounding conductive sheet is electrically connected to the control printed circuit board, and the other end comprises a first engaging member and iii) a metal bezel configured to lock around the frame, the metal bezel including a second engaging member, wherein the second engaging member engages with the first engaging member.

18 Claims, 6 Drawing Sheets

GROUNDING STRUCTURE FOR A LIQUID CRYSTAL MODULE

RELATED APPLICATIONS

This application is a divisional application, and claims the benefit under 35 U.S.C. §120 of U.S. application Ser. No. 10/671,386, filed Sep. 25, 2003 now U.S. Pat. No. 7,038,741, the full disclosure of which is incorporated herein by reference.

This application also relates to U.S. patent application entitled "LIQUID CRYSTAL MODULE", filed on even date herewith and having application Ser. No. 11/386,993, which is hereby incorporated by reference.

BACKGROUND OF THE INVENTION

1. Field of Invention

The present invention relates to a frame structure and a grounding structure. More particularly, the present invention relates to a frame structure and a grounding structure of a liquid crystal module (LCM).

2. Description of Related Art

Liquid crystal display (LCD) has so many advantages, including high picture quality, small volume, light weight, low driving voltage and low power consumption, that LCDs are widely applied in electronic products such as medium or small-sized portable televisions, mobile phones, videos, notebooks, monitors for desktop computers and projection-type televisions. Therefore, as time goes by, LCDs gradually replace present cathode ray tube (CRT) monitors.

The primary processes to manufacture a LCD includes a thin film transistor array substrate process, a color filter layer process, a liquid crystal cell assembling process, and a liquid crystal module (LCM) assembling process.

The LCM assembling process is to assemble a metal bezel, a liquid crystal display panel and a back light module together. After finishing the LCM assembling process, the processes to manufacture a LCD is completed. More specifically, the LCM assembling process is to overlap the liquid crystal display panel, on which a flexible printed circuit board (FPC) is fastened, with the back light module first. Then, the metal bezel locks with the fame, wherein the FPC is bent to be secured at back of the fame and is electrically connected to a control printed circuit board.

However, a lot of problems exist in the conventional LCM assembling process. For example, reference is made to FIG. 1, which illustrates how to fixedly secure a flexible printed circuit board (FPC) 12 on a frame 11 according to prior arts. When the driving ICs are attached on the liquid crystal display panel (not shown) by chip-on-glass (COG) technique, the area of the FPC 12, which is connected to the driving ICs, is large. According to the conventional method, the FPC 12 is fastened on the frame 11 via the tape 13 because of large area of the FPC 12. However, this kind of assembly procedure takes a lot of time. Besides, owing to adoption of COG technique, the FPC 12 is bent twice, and the produced torsion easily makes the FPC 12 separate outward from the frame 11. The FPC 12 is not thoroughly secured on the frame 11.

Moreover, as far as the control printed circuit board (control PCB) 14, which is electrically connected to the connector 15 and the FPC 12, is fastened on the frame 11 via the screws. However, this kind of assembly procedure takes a lot of time and consumes cost of screws.

Reference is made to FIG. 2, which is a partial perspective view illustrating a structure of a conventional LCM. The control PCB 14 is electrically connected to the grounding copper foil 16 by welding at one end, and keeps electrically contact with the metal bezel 10 at the other end. The grounding copper foil 16 is fastened on the metal bezel 10 via the screw through the hole 17. However, this kind of assembly procedure takes a lot of time and consumes cost of screws. In case that the metal bezel 10 is not thick enough, the space is limited to form a hole 17 for securing the grounding copper foil 16 on the metal bezel 10 via the screw.

SUMMARY OF CERTAIN INVENTIVE ASPECTS

One aspect of the present invention provides a frame structure adapted for fixedly securing a FPC which is electrically connected to a liquid crystal display panel, and for fixedly securing a control PCB which is electrically connected to the FPC.

Another aspect of the present invention provides a grounding structure for protecting a control PCB of a LCD from electro-magnetic interference.

Another aspect of the present invention provides a frame structure of a liquid crystal module, the frame being adapted for fixedly securing a flexible printed circuit board which is electrically connected to a liquid crystal display panel, and for fixedly securing a control printed circuit board which is electrically connected to the flexible printed circuit board, is provided. The frame includes a plurality of fasteners and a recess for receiving the control printed circuit board. Each fastener including a first clip piece and a second clip piece. A periphery of the recess includes a slot, a plurality of protrusions and a plurality of resilient engaging pieces. By clipping the flexible printed circuit board between the first clip piece and the second clip piece, the flexible printed circuit board is fixedly secured on the frame. By engaging the control printed circuit board on the recess with the slot, the protrusions and the resilient engaging pieces, the control printed circuit board is fixedly secured on the frame.

Another aspect of the present invention provides a grounding structure of a liquid crystal module, the grounding structure being adapted for protecting a control printed circuit board of the liquid crystal module from electro-magnetic interference, is provided. The grounding structure includes frame for receiving the control printed circuit board, a grounding conductive sheet, and a metal bezel for locking around the frame. One end of the grounding conductive sheet is electrically connected to the control printed circuit board, and the other end comprises a first engaging member. The metal bezel includes a second engaging member, wherein the second engaging member engages with the first engaging member.

It is to be understood that both the foregoing general description and the following detailed description are examples only, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF CERTAIN INVENTIVE EMBODIMENTS

Figure 1:
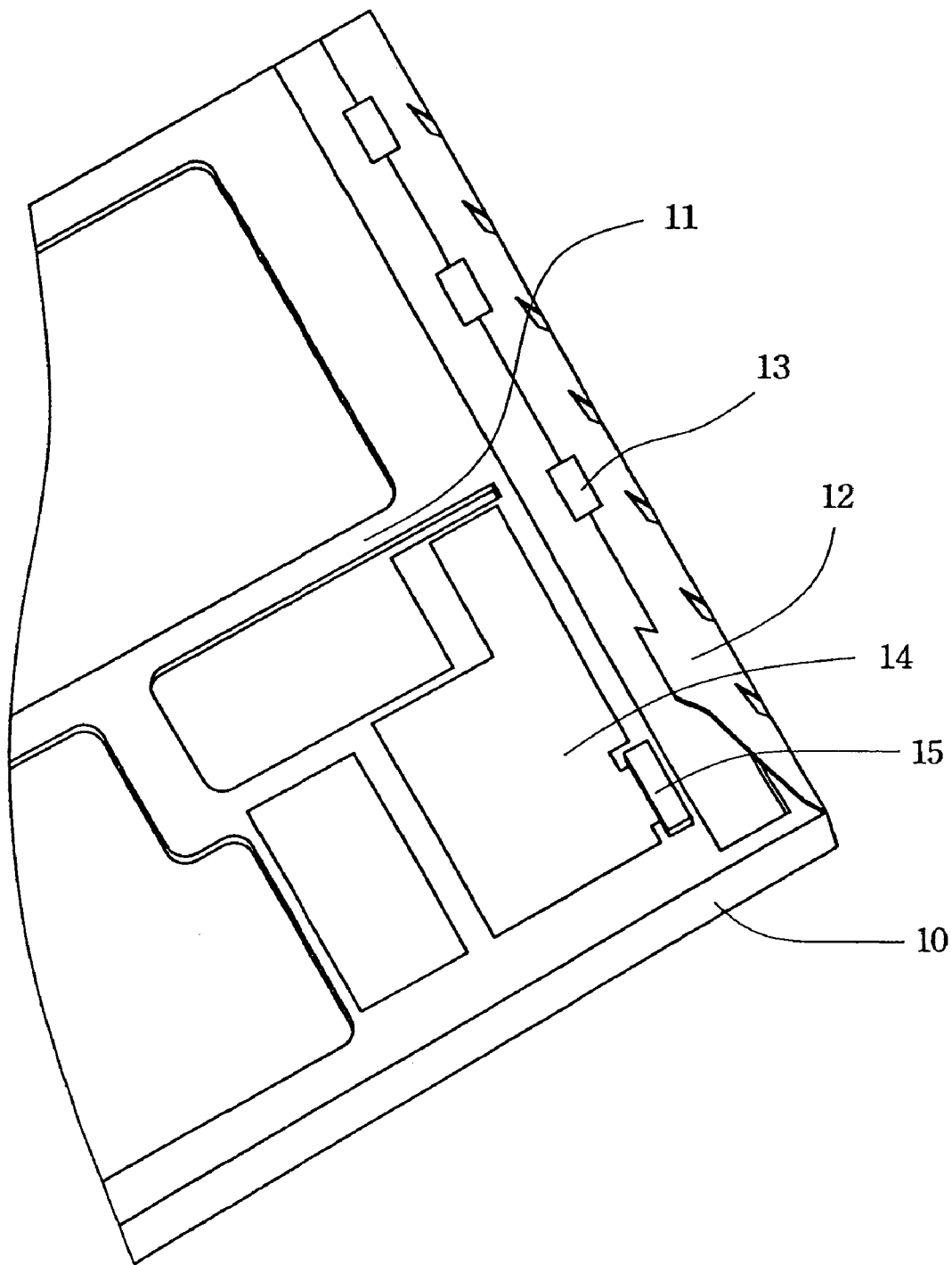
FIG. 1 illustrates how to fixedly secure a flexible printed circuit board on a frame according to prior arts.
Figure 2:
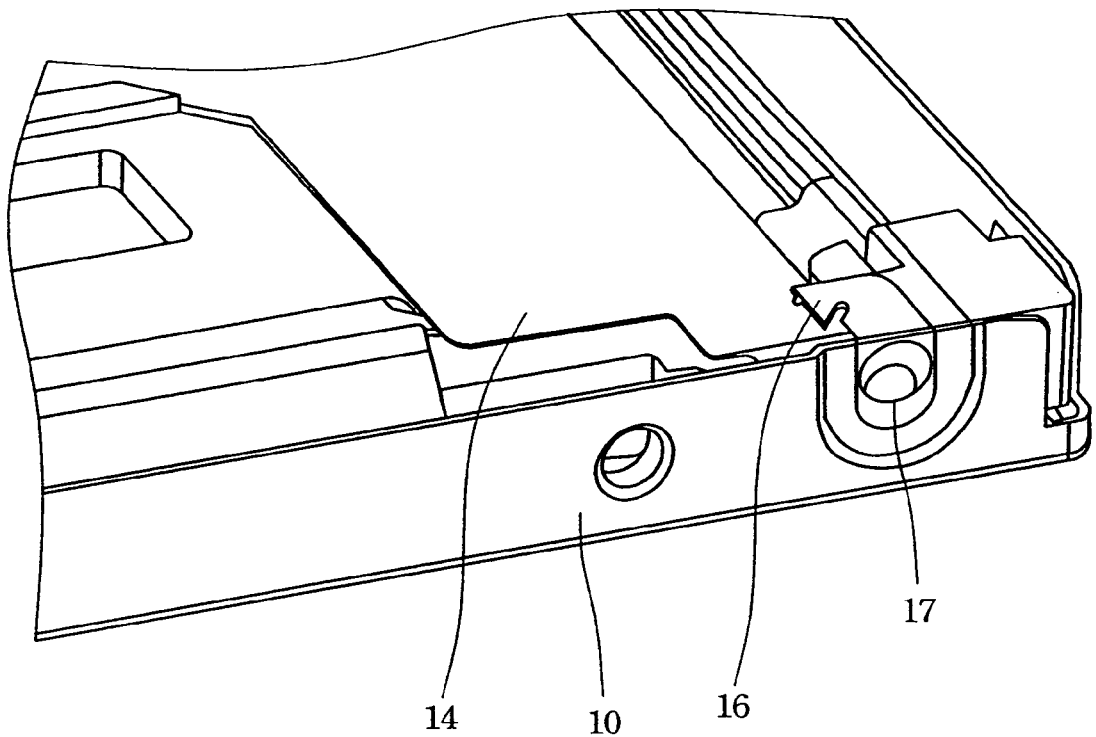
FIG. 2 is a partial perspective view illustrating a structure of a conventional LCM.

Reference will now be made in detail to the present preferred embodiments of the invention, examples of which are illustrated in the accompanying drawings. Wherever possible, the same reference numbers are used in the drawings and the description to refer to the same or like parts.

Figure 3:
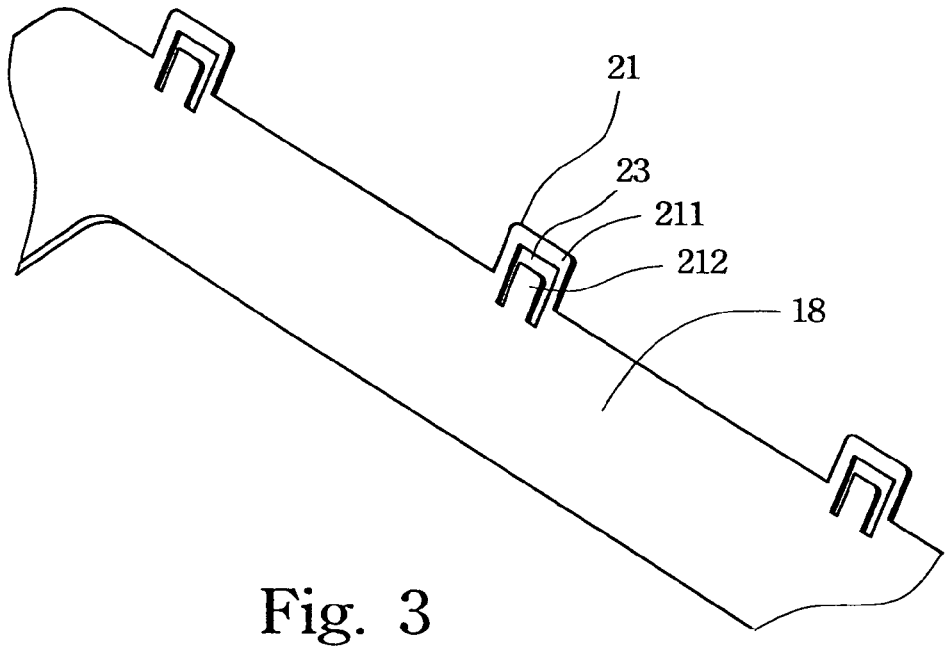
FIG. 3 is a partial perspective view illustrating a structure of a frame in accordance with the present invention.
Figure 4:
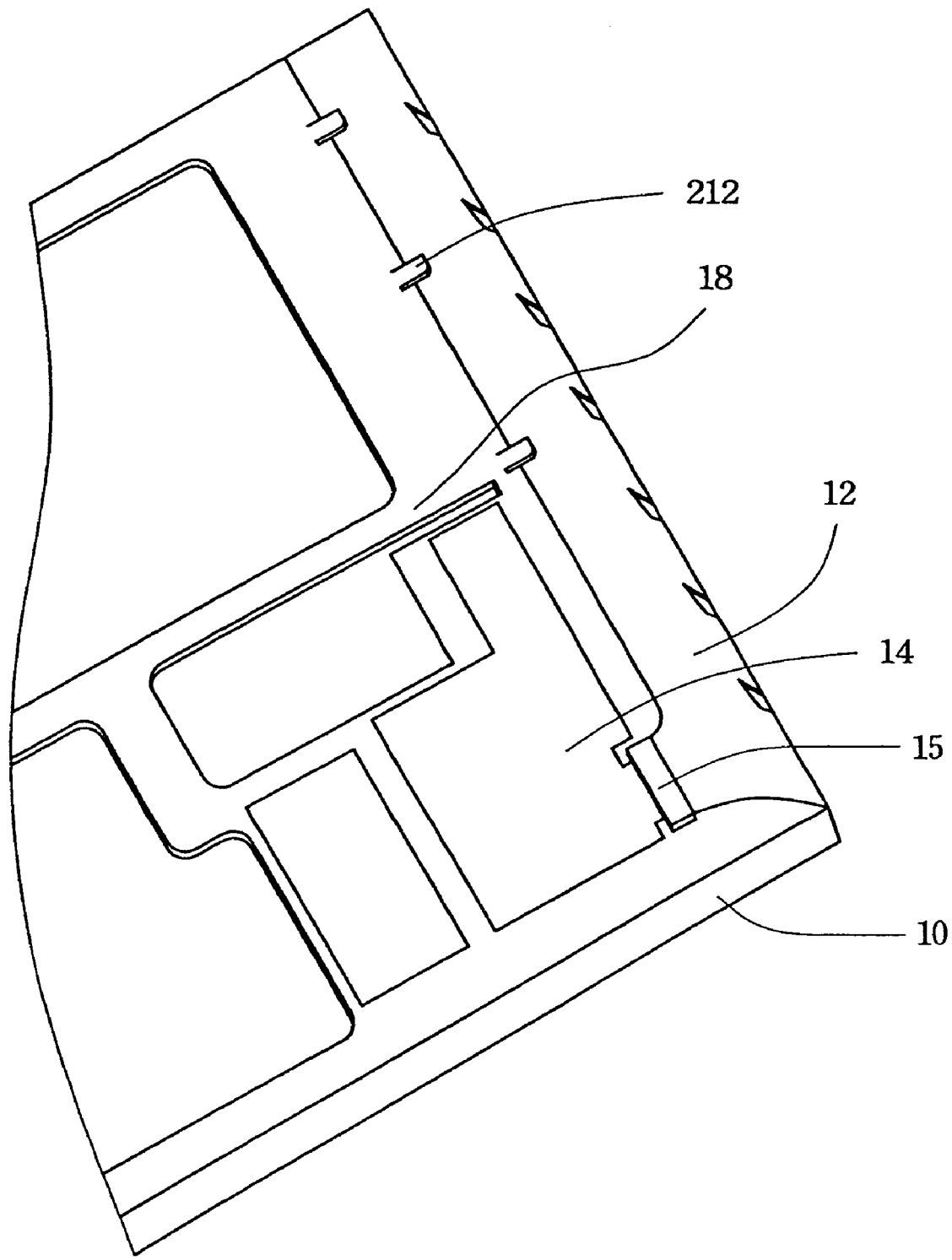
FIG. 4 illustrates how to fixedly secure a flexible printed circuit board on a frame according to the present invention.

Reference is made to FIG. 3, which is a partial perspective view illustrating a structure of a frame in accordance with the present invention. The frame 18 can be formed by integral injection molding, and is preferably made of plastic. A plurality of fasteners 21 are formed on the frame 18. Each fastener 21 includes a first clip piece 212 and a second clip piece 211. Covered area of the first clip piece 212 is larger than covered area of the second clip piece 211. A gap 23 is disposed between the first clip piece 212 and the second clip piece 211. As shown in FIG. 4, to assemble the FPC 12 with the frame 18, the FPC 12 is inserted into a position between the first clip piece 212 and the second clip piece 211.

Figure 5:
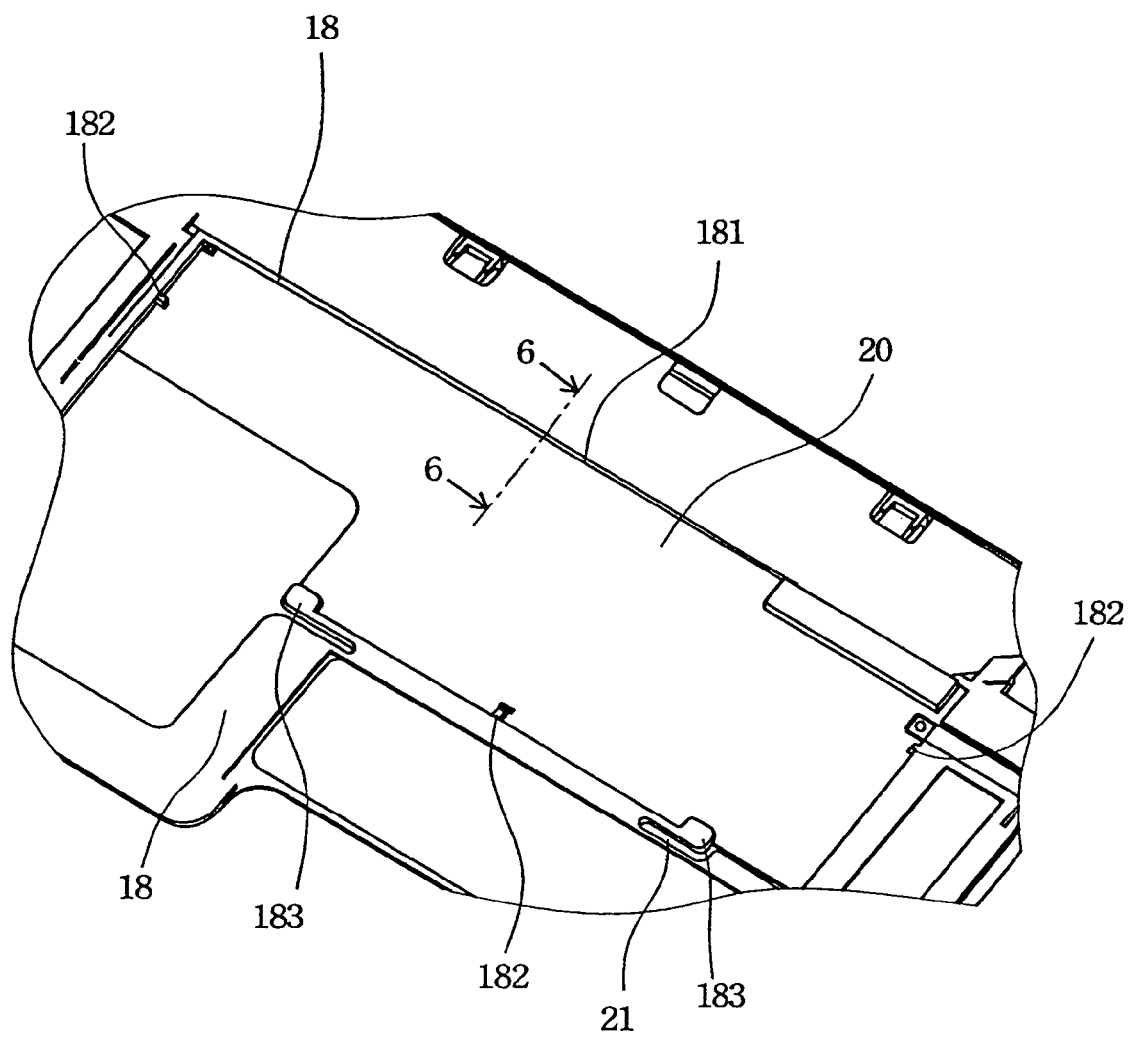
FIG. 5 illustrates how to fixedly secure a control printed circuit board on a frame according to the present invention.
Figure 6:
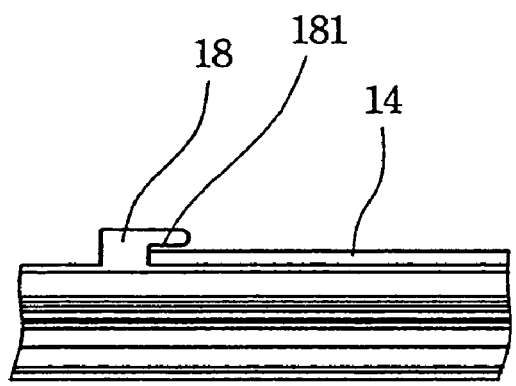
FIG. 6 is a perspective, cross-sectional view of FIG. 5 taken along 6-6.

Reference is made to FIGS. 5 and 6. FIG. 5 illustrates how to fixedly secure a control printed circuit board on a frame according to the present invention. FIG. 6 is a perspective, cross-sectional view of FIG. 5 taken along 6-6. A recess 20 is formed on the frame 18 for receiving the control PCB 14. A periphery of the recess 20 includes a slot 181, a plurality of protrusions 182 and a plurality of resilient engaging pieces 183. A gap 21 is disposed between the resilient engaging piece 183 and a body of the frame 18. To assemble the control PCB 14 with the frame 18, the control PCB 14 is inserted into the slot 181, and positioned by the protrusions 182. After the resilient engaging pieces 183 are pulled backward and is released, the control PCB 14 can be fastened into the recess 20. By engaging the control PCB 14 on the recess with the slot 181, the protrusions 182 and the resilient engaging pieces 183, the control PCB 14 is fixedly secured on the frame 18.

Figure 7:
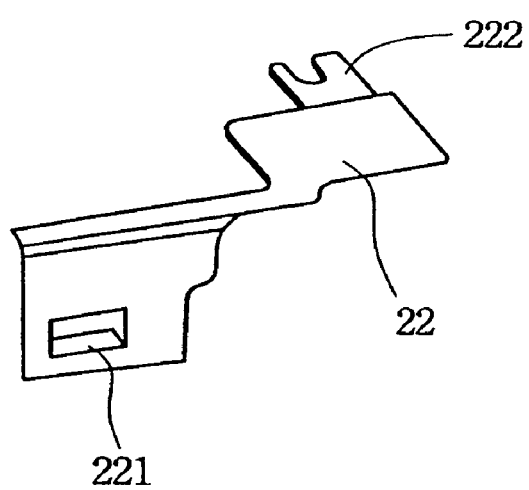
FIG. 7 is a perspective view illustrating a structure of a grounding copper foil in accordance with the present invention.
Figure 8:
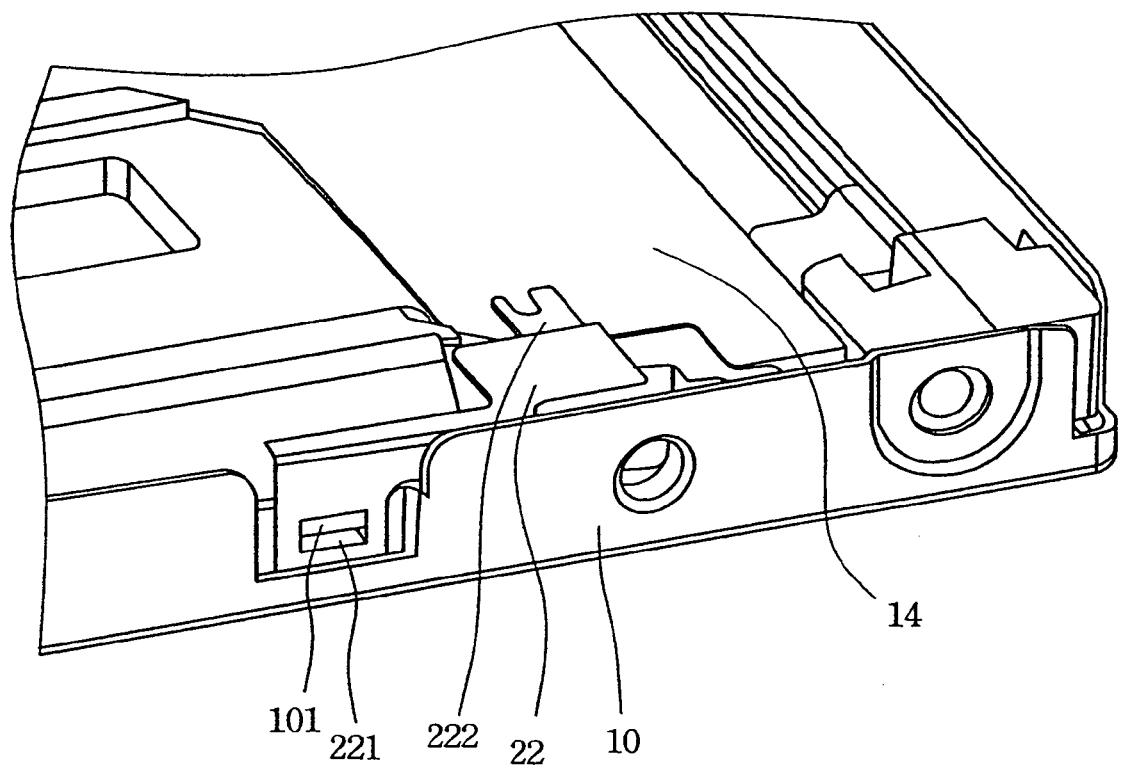
FIG. 8 is a partial perspective view illustrating a structure of a grounding structure in accordance with the present invention.

Reference is made to FIGS. 7 and 8. FIG. 7 is a perspective view illustrating a structure of a grounding copper foil in accordance with the present invention. FIG. 8 is a partial perspective view illustrating a structure of a grounding structure in accordance with the present invention. To assemble the grounding copper foil 22 with the LCM, a soldering portion 222 of the grounding copper foil 22 is welded onto the control PCB 14, and a resilient piece 221 of the grounding copper foil 22 engages with a hook 101 of the metal bezel 10. Certainly, other kinds of designs to assemble the grounding copper foil 22 with the metal bezel 10 are also feasible. For example, an opening is formed on the grounding copper foil 22, and a hook is formed on the metal bezel 10, wherein the opening can engage with the hook.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A grounding structure for a liquid crystal module, the grounding structure being adapted to protect a control printed circuit board of the liquid crystal module from electro-magnetic interference, the grounding structure comprising:

a frame for receiving the control printed circuit board;

a grounding conductive sheet, wherein one end of the grounding conductive sheet having a first surface and the grounding conductive sheet is electrically connected to the control printed circuit board, and the other end comprises a first engaging member, wherein the first engaging member has a second surface and a hole and a resilient piece thereon, and the area of the resilient piece is substantially equal to the area of the hole; and a metal bezel covering the frame for locking around the frame, the metal bezel including a third surface with a second engaging member, wherein the second engaging member engages with the resilient piece and the second surface is nearly parallel to the third surface;

wherein the first surface is nearly parallel to a surface of the control printed circuit board.

2. The grounding structure according to claim 1, wherein the second engaging member is made of metal.

3. The grounding structure according to claim 1, wherein the grounding conductive sheet is made of copper.

4. The grounding structure according to claim 1, wherein the second engaging member comprises a hook configured to engage with the resilient piece.

5. The grounding structure according to claim 1, wherein the second engaging member comprises a hook for engaging with said opening.

6. The grounding structure according to claim 1, wherein the one end of the grounding conductive sheet comprises a body portion and a soldering portion and wherein the soldering portion extends from the body portion and is configured to be welded onto the control printed circuit board.

7. The grounding structure according to claim 6, wherein an end of the soldering portion is concave.

8. The grounding structure according to claim 1, wherein the one end of the grounding conductive sheet is laterally spaced apart from and is substantially perpendicular to the other end of the grounding conductive sheet.

9. A grounding structure for a liquid crystal module, the grounding structure being adapted to protect a control printed circuit board of the liquid crystal module from electro-magnetic interference, the grounding structure comprising:

means for receiving the control printed circuit board;

grounding means, wherein one end of the grounding means has a first surface and the other end includes a first engaging member that has a second surface and an opening with a resilient piece thereon, and the area of the resilient piece is substantially equal to the area of the opening; and means for locking around the receiving means, wherein the locking means include a third surface with a second engaging member for engaging with the resilient piece, wherein the second surface is nearly parallel to the third surface and the first surface is nearly parallel to a surface of the control printed circuit board.

10. The grounding structure according to claim 9, wherein the grounding means includes a grounding conductive sheet.

11. The grounding structure according to claim 10, wherein the grounding conductive sheet is made of copper.

12. The grounding structure according to claim 9, wherein the locking means includes a metal bezel.

13. The grounding structure according to claim 9, wherein the second engaging member is made of metal.

14. The grounding structure according to claim 9, wherein the second engaging member comprises a hook configured to engage with the resilient piece.

15. The grounding structure according to claim 9, wherein the second engaging member comprises a hook for engaging with said opening.

16. The grounding structure according to claim 9, wherein one end of the grounding means comprises a body portion and a soldering portion and wherein the soldering portion extends from the body portion and is configured to be welded onto the control printed circuit board.

17. The grounding structure according to claim 16, wherein an end of the soldering portion is concave.

18. The grounding structure according to claim 9, wherein a first end of the grounding means is laterally spaced apart from and is substantially perpendicular to a second end of the grounding means.

* * * * *